(12) United States Patent
Cole, Sr. et al.

(10) Patent No.: US 6,969,830 B2
(45) Date of Patent: *Nov. 29, 2005

(54) WAFER CHUCK HAVING THERMAL PLATE WITH INTERLEAVED HEATING AND COOLING ELEMENTS

(75) Inventors: Kenneth M. Cole, Sr., Holliston, MA (US); William M. Stone, Lenox, MA (US); Douglas S. Olsen, Natick, MA (US)

(73) Assignee: Temptronic Corporation, Sharon, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/465,716

(22) Filed: Jun. 19, 2003

(65) Prior Publication Data

US 2003/0213793 A1 Nov. 20, 2003

Related U.S. Application Data

(63) Continuation of application No. 09/900,285, filed on Jul. 6, 2001, now Pat. No. 6,700,099.
(60) Provisional application No. 60/217,036, filed on Jul. 10, 2000.

(51) Int. Cl.[7] .......................... H01B 3/68; C27C 16/00
(52) U.S. Cl. .................................... 219/444.1; 118/724
(58) Field of Search .......................... 219/443.1, 444.1, 219/465.1, 466.1, 143, 144; 118/724, 725

(56) References Cited

U.S. PATENT DOCUMENTS

| | | | |
|---|---|---|---|
| 5,033,538 A | 7/1991 | Wagner et al. .............. 165/80.1 |
| 5,034,688 A | * 7/1991 | Moulene et al. ............. 324/760 |
| 5,099,571 A | 3/1992 | Logan et al. ................. 29/825 |
| 5,213,349 A | 5/1993 | Elliott ......................... 279/128 |
| 5,651,823 A | 7/1997 | Parodi et al. ................ 118/500 |
| 5,846,375 A | 12/1998 | Gilchrist et al. ............ 156/345 |
| 6,053,982 A | 4/2000 | Halpin et al. ............... 118/728 |
| 6,147,334 A | * 11/2000 | Hannigan .................... 219/544 |

FOREIGN PATENT DOCUMENTS

| DE | 33 06 999 A1 | 2/1983 | ........... H01L/21/68 |
|---|---|---|---|
| JP | 10050811 | 2/1998 | ........... H01L/21/68 |
| WO | WO 01/01460 | 1/2001 | ........... H01L/21/00 |

* cited by examiner

*Primary Examiner*—Sang Y. Paik
(74) *Attorney, Agent, or Firm*—Mills & Onello LLP (57) ABSTRACT

A workpiece chuck includes a thermal plate assembly which includes both heating and cooling capability. The heating element can be a resistive heater in a coiled configuration disposed in a plane. The cooling can be performed via a cooling fluid circulated through cooling tubes which are also disposed in a coiled configuration in a plane. The plane of the heating element and the cooling tubes can be the same plane, and that plane can be a center plane of the thermal plate assembly. By locating the heating and cooling in the same plane, uniform heating and cooling are achieved. Also, by locating the heating element and cooling tubes in the center of the thermal plate, distortions such as doming and dishing in the thermal plate are eliminated such that the wafer can be held extremely flat on the chuck. The heating element and cooling tubes are coiled in an interleaved fashion to provide uniform heating and cooling while allowing them to simultaneously occupy the same plane.

20 Claims, 6 Drawing Sheets

WAFER CHUCK HAVING THERMAL PLATE WITH INTERLEAVED HEATING AND COOLING ELEMENTS

RELATED APPLICATIONS

This application is based on U.S. Provisional Patent Application Ser. No. 60/217,036, filed on Jul. 10, 2000.

This application is a continuation of U.S. patent application Ser. No. 09/900,285, filed Jul. 6, 2001 now U.S. Pat. No. 6,700,099, the contents of which are incorporated herein in their entirety by reference.

BACKGROUND OF THE INVENTION

A workpiece chuck can be used to hold workpieces such as semiconductor wafers during processing and testing. Because integrated circuits formed in a wafer under test are commonly tested over temperature, the workpiece chuck can include a temperature control system for controlling the temperature of the wafer during testing. As integrated circuits become smaller and more densely integrated, positioning tolerances for testing systems such as wafer probers decrease. With very small positioning tolerances, it is very important that the chuck supporting the wafer during testing be mechanically stable. This requirement is especially challenging in a temperature-control chuck where the chuck must maintain mechanical and electrical stability over a wide range of temperatures. At temperature extremes, particularly at high temperatures, conventional wafer chucks tend to distort due to thermal expansion and contraction and the integrity of the materials of which the chucks are constructed. For example, chucks made of softer materials will tend to distort at high temperature. This problem is exacerbated by the increasing mechanical loads on the chuck introduced by the test system, i.e., the wafer prober.

SUMMARY OF THE INVENTION

The present invention is directed to various aspects of a workpiece chuck which overcome drawbacks of conventional chucks to provide a chuck with improved mechanical and electrical stability. According to a first aspect of the invention, there is provided a thermal control apparatus, or thermal plate assembly, and method, which can be used to control temperature in a workpiece chuck. The thermal control apparatus includes a heating element and a cooling element. The heating element is disposed in a heating plane, and the cooling element is disposed in a cooling plane. The heating plane and the cooling plane can be coplanar, i.e., they are the same plane.

The thermal plate assembly of the invention can be a layer in the workpiece chuck. Because the heating and cooling elements occupy the same horizontal plane of the chuck, the heating and cooling are uniform across the top surface of the chuck where the workpiece, i.e., wafer, is supported. Also, because the heating and cooling elements are coplanar, substantial distortion and warping of the chuck and workpiece over temperature are eliminated.

The heating element can include an electrical resistive heating coil element. The heating coil element can be disposed in the heating plane in a coiled configuration.

The cooling element can include one or more hollow tubes for circulating a temperature-controlled fluid through the thermal plate assembly. The circulating tubes can be disposed in the cooling plane in a coiled configuration.

To facilitate locating both the heating element and the cooling element in the same plane in coiled configurations, the heating and cooling elements are spatially interleaved with each other. The interleaved nature of the heating and cooling elements also provides more uniform heating and cooling of the chuck and, therefore, more uniform temperature across the surface of the wafer. Also, warping and other distortion of the chuck over temperature are substantially eliminated, such that the chuck can hold the wafer extremely flat over temperature.

In one embodiment, warping and other distortions over temperature are further reduced by the selection of the location of the heating and cooling plane within the thermal plate assembly. In this embodiment, the heating and cooling planes are located in a center plane of the thermal plate assembly, i.e., the plane that is equidistant from the top and bottom surfaces of the thermal plate assembly. With the heating and cooling planes located at the vertical center of the thermal plate assembly, distortions caused by doming and/or dishing of the thermal plate assembly are substantially eliminated. Again, with the reduction in chuck distortion over temperature, the wafer can be held flat over temperature.

In one embodiment, the thermal plate assembly of the invention is made from a cast material, which, in one particular embodiment, is aluminum. The casting of the housing provides the thermal plate assembly with improved mechanical rigidity and stability over temperature. The housing casting can be stress relieved such as by heat treating at predetermined manufacturing steps. For example, stress relieving can be performed both before and after finish machining of the housing. The stress relief provides the housing with more mechanical stability over temperature. Also, the housing casting can be formed with the tubes for circulating the cooling fluid. With the stress relief procedure, even more mechanical stability is provided.

In another aspect, the invention is directed to a workpiece chuck capable of implementing interchangeable top surface assemblies. In accordance with this aspect, the workpiece chuck of the invention includes a lower support and the thermal plate assembly on the lower support. The top of the thermal plate assembly includes a mount apparatus capable of holding multiple types of top surface assemblies, which are used to hold the workpiece/wafer to the chuck.

This configuration provides the chuck of the invention with flexibility according to the setting in which the chuck is being used. For example, one type of top surface assembly may be required where the test being performed requires the chuck to be able to absorb a large amount of power. In another test, the top surface assembly may be required to provide low electrical capacitance, high voltage or high electrical isolation performance. In still another test, the top surface assembly may be required to provide for very low signal leakage. In each of these tests, the top surface assembly may be fabricated differently to provide optimal performance under the specific testing parameters. In a conventional chuck system, this would require the user to obtain several different chucks, one for each test type. However, in accordance with this aspect of the invention, the thermal plate assembly of the invention provides a universal type mount which can accommodate all of the various top surface assemblies. As a result, the user need only have a single thermal plate assembly. The user can then purchase only the top surface assemblies required for the tests to be performed. This results in considerable cost savings to the user.

In another aspect, the invention is directed to an approach to eliminating the negative effects resulting from the relative movement of layers of the workpiece chuck over temperature. When two adjacent chuck layers have different thermal expansion coefficients, they tend to rub each other over temperature. This can cause abrasion of the surfaces which can degrade chuck performance. This is especially true in one particular example where a top surface assembly made of a hard abrasive ceramic material is located adjacent to the cast aluminum housing of the thermal plate assembly. To reduce these effects, one or more adjacent surfaces can be coated with a hard coating, such as hard anodize.

In accordance with this aspect, the invention includes a lower support and the thermal plate assembly mounted on the lower support. An upper support, e.g., top surface assembly, by which the workpiece can be mounted to the chuck, is mounted over the thermal plate assembly. A hard coating layer, a hard anodize layer for example, is adhered to a surface and interposed between the thermal plate assembly and the upper support assembly.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

The present invention is directed to and is applicable in temperature-controlled workpiece chucks of the type described in, for example, U.S. Pat. No. 6,019,164, issued Feb. 1, 2000, entitled, "Workpiece Chuck," assigned to Temptronic Corporation, and incorporated herein in its entirety by reference; U.S. Pat. No. 6,073,681, issued Jun. 13, 2000, entitled, "Workpiece Chuck," assigned to Temptronic Corporation, and incorporated herein in its entirety by reference; and copending U.S. patent application Ser. No. 09/473,099, filed on Dec. 28, 1999, entitled, "Workpiece Chuck," assigned to Temptronic Corporation, and incorporated herein in its entirety by reference.

These chucks include a heater for heating the wafer under test and a heat sink for removing heat to cool the wafer. In accordance with the present invention, the heater and heat sink are formed in one integral assembly referred to herein as a thermal plate or thermal plate assembly. In one embodiment, the housing of the thermal plate assembly is made of a cast material such as a metal. The cast metal provides mechanical strength, rigidity and stability over temperature. The cast material can be aluminum. It can be pure aluminum or an alloy of aluminum or any material which provides low thermal distortion, i.e., distortion over temperature due to temperature effects.

The heater includes one or more electrical resistive heating elements coiled in a plane within the thermal plate cast housing. The heater can include multiple heating elements contained within a sheath. Because of the electrical current flowing through the heater elements during heating, the heater elements are highly isolated from the remainder of the thermal plate assembly and the chuck to prevent interference with the testing being performed. In one particular embodiment, the isolation of the heating elements is over 100 Gigohms. The heat sink portion of the thermal plate can include one or more tubes coiled in a plane within the thermal plate housing for circulating a temperature-controlled fluid through the plate.

The thermal plate is configured as a layer in the chuck. In general, the thermal plate is located between the base of the chuck by which the chuck is mounted on a host machine, e.g., a wafer prober, and the top surface assembly on which the wafer under test is mounted. Heat from the heating elements is conducted through the plate casting up to the wafer to heat the wafer. When cooling the wafer, heat is conducted down through the plate casting and is carried away by the circulating fluid. Thus, the combination of the heating elements and the circulating fluid allow the temperature of the chuck and the wafer it supports to be very precisely controlled. The temperature of the chuck and wafer can be controlled via the thermal plate in accordance with copending U.S. patent application Ser. No. 09/001,887, filed on Dec. 31, 1997, entitled, "Temperature Control System for a Workpiece Chuck," assigned to Temptronic Corporation, and incorporated herein in its entirety by reference.

In accordance with the invention, it is recognized that if the plane in which the heating elements are disposed and the plane in which the heat sink fluid tubes are disposed are offset from each other in the vertical direction, then various problems result, including physical distortions in the chuck. These distortion effects prevent the wafer from being held flat during processing.

Figure 1:
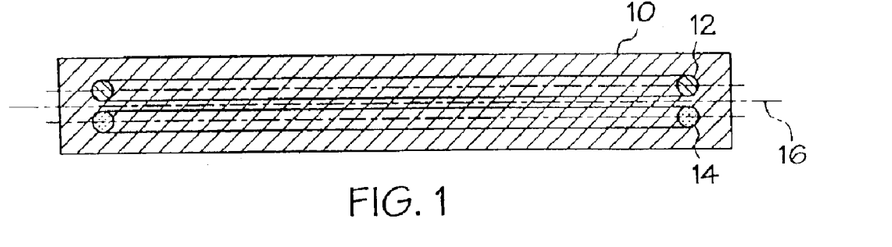
FIG. 1 contains a schematic cross-sectional diagram of a thermal plate assembly in which the heating and cooling elements are not in the same plane.

FIGS. 1–4 are schematic cross-sectional views of thermal plates illustrating possible layouts of the heating elements and cooing tubes. In FIG. 1, the general case in which the heaters and cooling tubes do not lie in the same plane is illustrated. Specifically, the case in which the heater 12 is located above the cooling tubes 14 within the casting 10 is illustrated. In this case, because of thermal expansion and contraction effects, when the heater 12 and/or the cooling tubes 14 are active, the housing 10 will tend to bow up in the middle, resulting in distortion in the chuck and the wafer.

Figure 2:
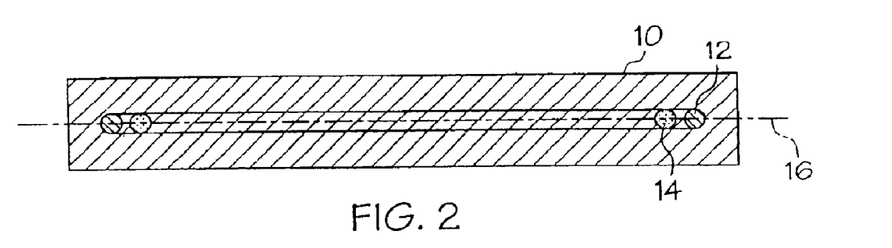
FIG. 2 contains a schematic cross-sectional diagram of a thermal plate assembly in which the heating and cooling elements are located in the same plane at the center line of the thermal plate assembly, in accordance with one embodiment of the invention.

FIG. 2 illustrates the configuration in accordance with the invention in which the heaters 12 and cooling tubes 14 are disposed in the same plane. In this configuration, the distortions due to the heaters 12 and tubes 14 being in different planes are eliminated.

Figure 3:
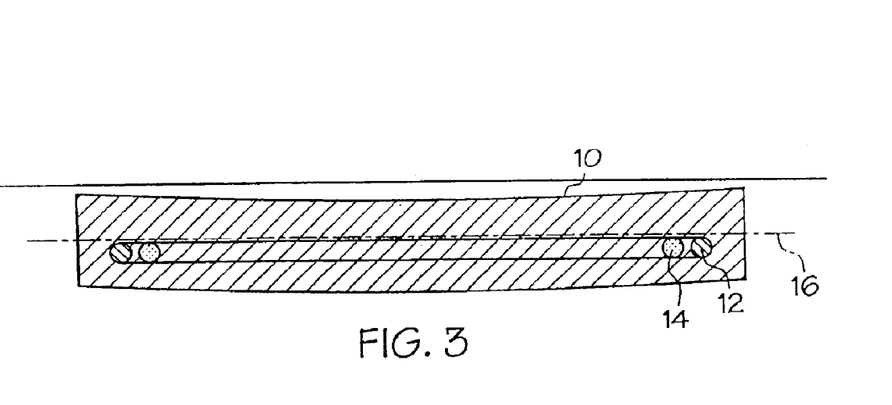
FIG. 3 contains a schematic cross-sectional diagram of a thermal plate assembly in which the heating and cooling elements are in the same plane located below the center line of the thermal plate assembly, to illustrate dishing on the top surface of the thermal plate assembly.
Figure 4:
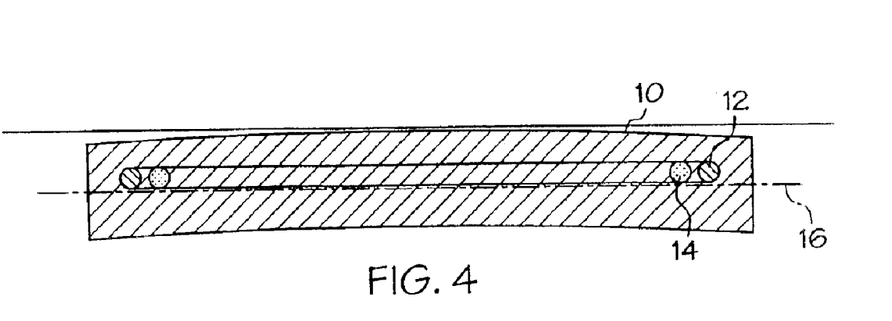
FIG. 4 contains a schematic cross-sectional diagram of a thermal plate assembly in which the heating and cooling elements are in the same plane located above the center line of the thermal plate assembly, to illustrate doming on the top surface of the thermal plate assembly.

In accordance with the invention, it is also recognized that it is preferable that the plane in which the heaters 12 and tubes 14 are disposed be located along the center of the housing 10 in the vertical dimension. That is, the plane in which they are disposed should include the horizontal center line 16 shown in FIG. 2. It is recognized that if the heaters 12 and tubes 14 are not located at the center of the thermal plate 10, then distortions result as shown in FIGS. 3 and 4. FIG. 3 illustrates the situation in which the heaters 12 and tubes 14 are located below the casting center line 16. In this case, the cast housing 10 bows down when heat is applied, resulting in a dish shape at the top surface of the chuck and the wafer. When cooling is applied, the opposite occurs, i.e., the housing 10 bows up, resulting in a dome shape at the top surface of the chuck and wafer. FIG. 4 illustrates the situation in which the heaters 12 and tubes 14 are located above the casting center line 16. In this case, the cast housing 10 bows up when heat is applied, resulting in a dome shape at the top surface of the chuck and the wafer. When cooling is applied, the housing 10 bows down, resulting in a dish shape at the top surface of the chuck and the wafer. Hence, it is preferred that the plane in which the heaters 12 and tubes 14 are located be at the center line of the cast housing 10.

Figure 5:
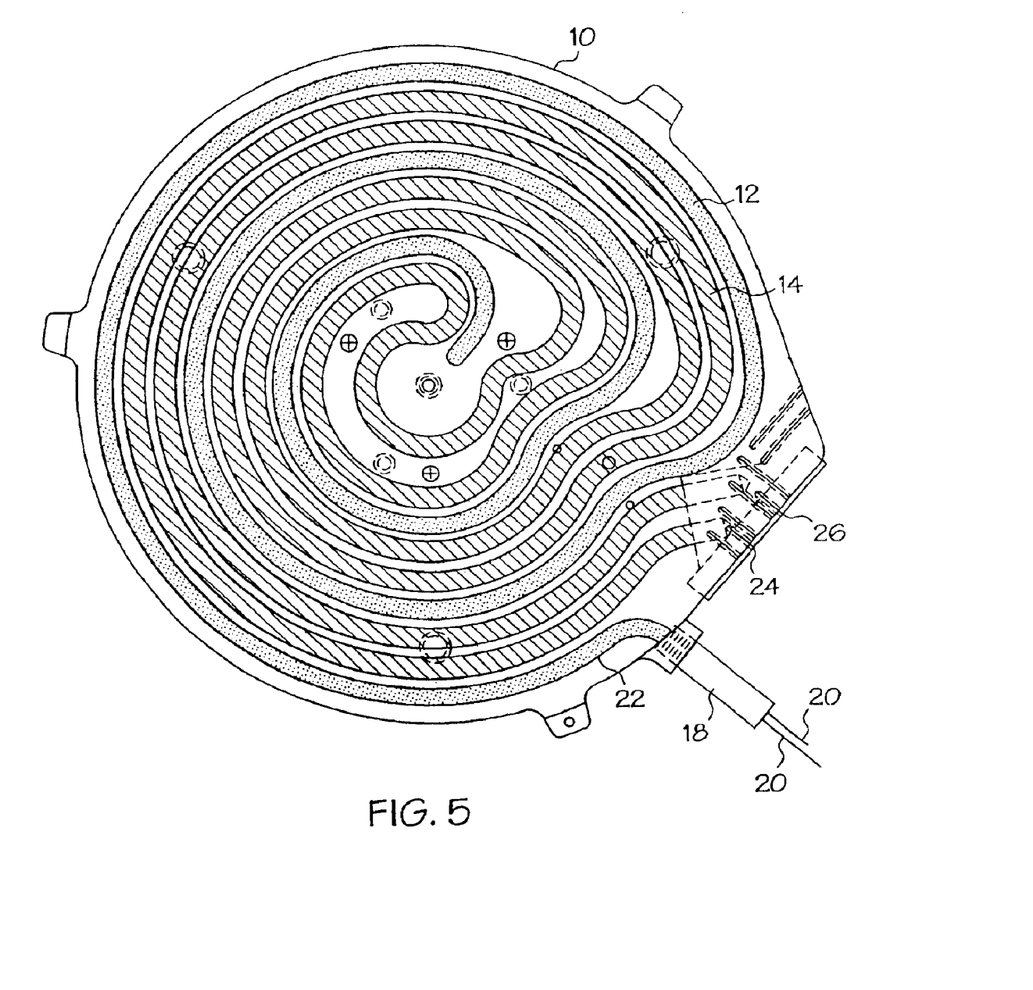
FIG. 5 contains a schematic top plan view of one embodiment of the thermal plate assembly of the invention, illustrating the interleaved configuration of the heating and cooling elements.

FIG. 5 is a schematic top plan view of the thermal plate 10 of the invention with heating elements 12 and coolant circulating tube 14. Because the heaters 12 and cooling tube 14 are coiled in the same plane, they are interleaved with each other as shown. The heater 12 is electrically connected to a power source (not shown) via a connector 18 and wires 20. As described below in connection with FIG. 6, the heater 12 can actually include multiple heating elements enclosed in a sheath 22. The cooling fluid is circulated through the thermal plate 10 by tube 14. The fluid enters the plate 10 at an inlet port 24, flows in a spiral fashion through the coiled tube 14 to the center of the plate 10 and flows back out to the edge of the plate 10 in a spiral fashion in the coiled tube 14. The fluid exits the plate 10 at an outlet port 26. Both the heater 12 and cooling tube 14 are coiled in a spiral fashion within the plate 10 to provide efficient and uniform heat transfer to and from the chuck and wafer. This ensures highly accurate and uniform temperature setting and wafer testing.

Figure 6:
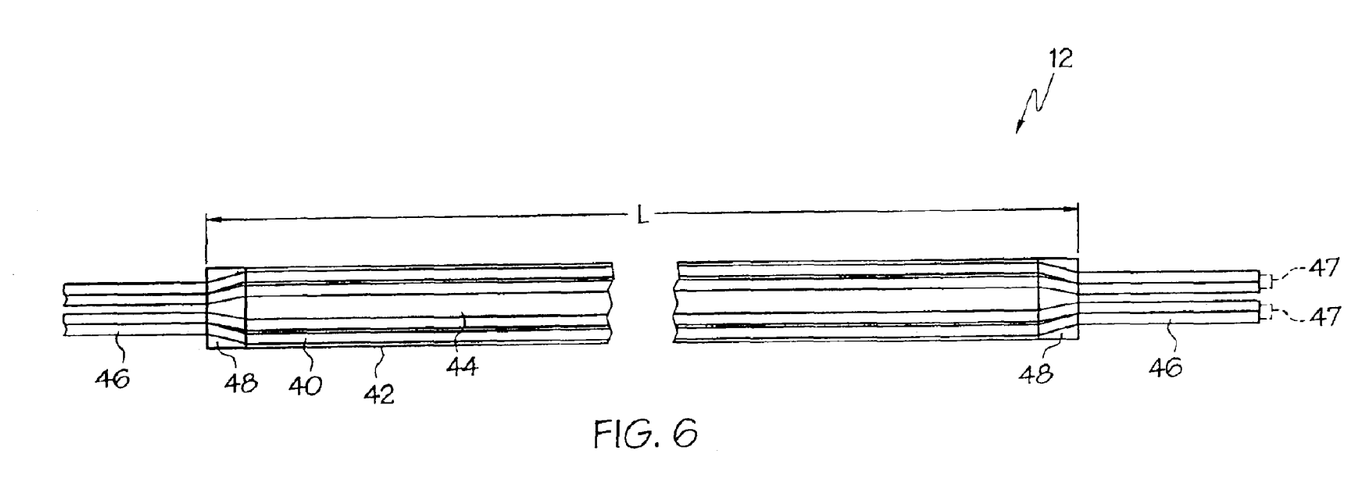
FIG. 6 contains a schematic cross-sectional view of one embodiment of a heater with multiple heating elements within a single sheath, in accordance with the present invention.

FIG. 6 is a schematic cross-sectional view of one embodiment of a heater 12 in accordance with the invention. The heater 12 actually includes multiple, four in this case, electrical resistive heating elements 40 which are enclosed in a rigid or flexible and formable sheath enclosure 42. In the system described herein, the sheath 42 is formable such that the coiled configuration can be obtained. The heating elements 40 are supported and insulated from each other within the sheath 42 by an insulating and supporting material 44. The insulating and supporting material 44 achieves extremely high electrical isolation of the heating elements 40 from each other, the sheath, which is electrically connected to the thermal plate assembly, and the rest of the chuck. In one embodiment, the insulating and supporting material 44 is made from highly compressed insulating material such as magnesium oxide. Because it is highly compressed, moisture is prevented from contaminating the material and reducing its isolation characteristics. In one embodiment, the heater assembly 12 achieves over 100 Gigohms of isolation between the conductive elements and the sheath 42. The heater 12 includes hermetically sealed ends 48 and insulated heater leads 46 at one or both ends for attachment to a power source (not shown). Where the power source is connected at only one end, leads at the opposite end of the heater 12 can be connected together. In FIG. 6, these connections 47 are shown in phantom at the right end of the heater 12. In this case, the left set of leads 46 can be connected to the power source to create two heater elements.

In accordance with the invention, steps are taken during fabrication of the thermal plate cast housing to ensure that distortion in the thermal plate and chuck due to thermal effects are eliminated and that the entire system exhibits superior thermal and mechanical performance. For example, the aluminum casting is heat treated for stress relief after casting and before finish machining operations are performed. The casting is heat treated for stress relief again after finish machining such that distortion in the finished casting due to thermal effects is eliminated. In one embodiment, the heating and cooling elements are cast into the aluminum housing, which be cylindrical or non-circular. The heating and cooling coils are also stress relieved.

Figure 7:
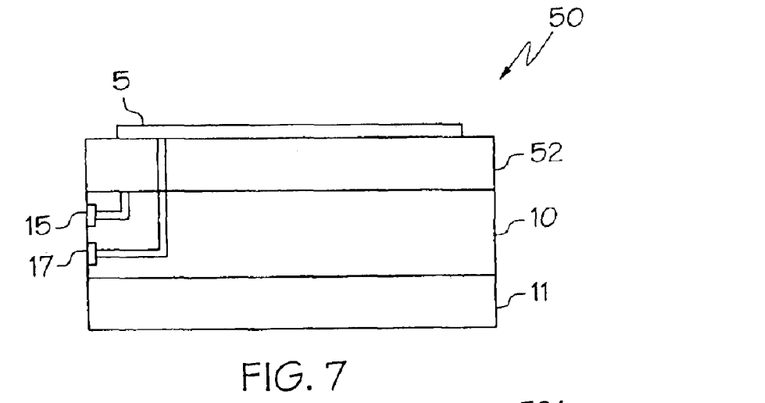
FIG. 7 contains a schematic cross-sectional view of one embodiment of a workpiece chuck including the thermal plate assembly of the invention.

Referring to FIG. 7, in one configuration, the thermal plate 10 serves as a layer of the wafer chuck 50. The thermal plate 10 is mounted over a chuck base 11 by which the chuck 50 is mounted on the host machine. The top surface assembly 52 of the chuck 50 is mounted on the top surface of the thermal plate 10. The top surface assembly 52 supports and holds the wafer 5 for processing. The top surface assembly 52 is held on the top of the thermal plate 10 by vacuum, and the wafer 5 is held on the top surface assembly 52 by vacuum. To that end, vacuum input ports 15 and 17 are provided in the thermal plate 10. Vacuum input port 15 is coupled to vacuum channels which convey vacuum to the top of the thermal plate 10. A vacuum pattern including vacuum grooves or channels is formed in the top of the thermal plate 10 to distribute vacuum over the top of the thermal plate to hold the top surface assembly 52 to the thermal plate 10. Vacuum input port 17 is coupled to vacuum channels which convey vacuum up through the top surface assembly 52 to its top surface. A vacuum pattern including vacuum grooves or channels is formed in the top of the surface assembly 52 to distribute vacuum over the top of the surface assembly to hold the wafer 5 to the top surface assembly 52.

In one embodiment, the configuration of the top surface assembly 52 can be selected based upon the type of test being performed on the wafer 5. Different surface assemblies are used for different tests. In accordance with the invention, different top surface assemblies 52 can be interchanged according to the test being performed. The thermal plate 10 is configured to accommodate each type of top surface assembly 52, and the surface assemblies 52 are all made to be mounted on the thermal plate 10. Thus, the thermal plate 10 serves as a temperature-controlled vacuum mount platform having a unique adaptability to multiple testing performance requirements.

Figure 8A:
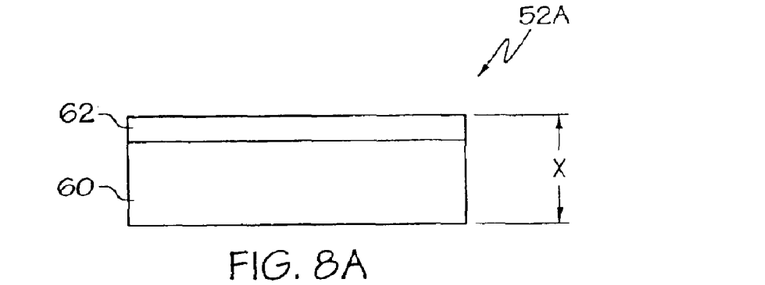
FIGS. 8A through 8C contain schematic cross-sectional view of various types of top surface assemblies, in accordance with the invention.
Figure 8B:
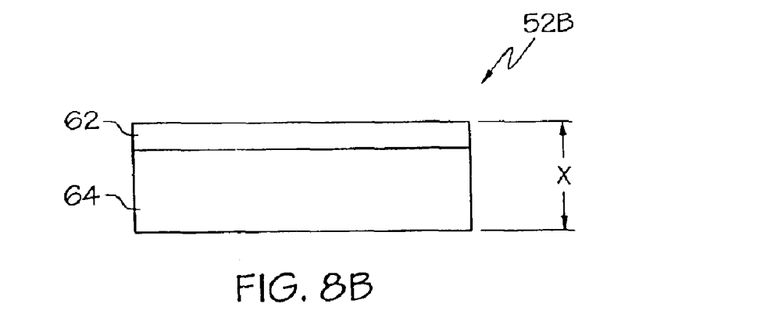
Figure 8C:
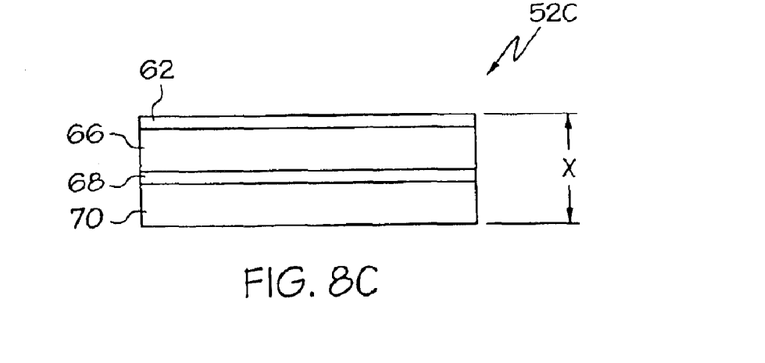

FIGS. 8A through 8C illustrate three different types of top surface assemblies 52A through 52C, respectively, which can be attached to the top of the thermal plate 10 for different tests. For example, one type of test being performed may require that high device power be absorbed by the surface 52, which would require that the surface 52 include a very thermally conductive material. In such a test, the top surface assembly 52A in FIG. 8A can be used. Surface assembly 52A includes a layer 60 of conductive material such as copper or aluminum covered by a plated or sputtered layer 62 of a conductive material such as gold, nickel or other such material. Another test may have very low electrical capacitance, high voltage or high isolation requirements. In such a case, the surface 52B of FIG. 8B can be used. Surface 52B includes an insulating dielectric layer 64, typically a ceramic material, covered by a plated or sputtered layer 62 of a conductive material such as gold, nickel or other such material. In another testing application, there may be a need for very low electrical signal leakage. This would require the surface assembly 52C of FIG. 8C. Surface assembly 52C includes a lower insulator layer 70 on which is mounted a conductive guard layer 68. An upper insulator layer 66 is positioned over the guard layer 68, and a plated or sputtered layer 62 of a conductive material such as gold, nickel or other such material is formed on the upper insulator 66. Alternatively, the top conductive layer 62 can be held by vacuum as described below in connection with FIG. 9. The guard layer 68 is driven with an excitation signal during testing to minimize test signal leakage due to isolation effects.

Each of the surfaces 52A through 52C is made to be of the same total thickness X such that they do not introduce a height difference when they are mounted on the thermal plate 10. This is true regardless of the number of layers in the assembly 52. Locating pins are provided between the thermal plate 10 and the surface assembly 52 as an aid in mounting the surface 52 on the plate 10. The locating pins also serve to hold the components together when vacuum is not present. Mechanical latches can also be used to secure the components when vacuum is removed.

Figure 9:
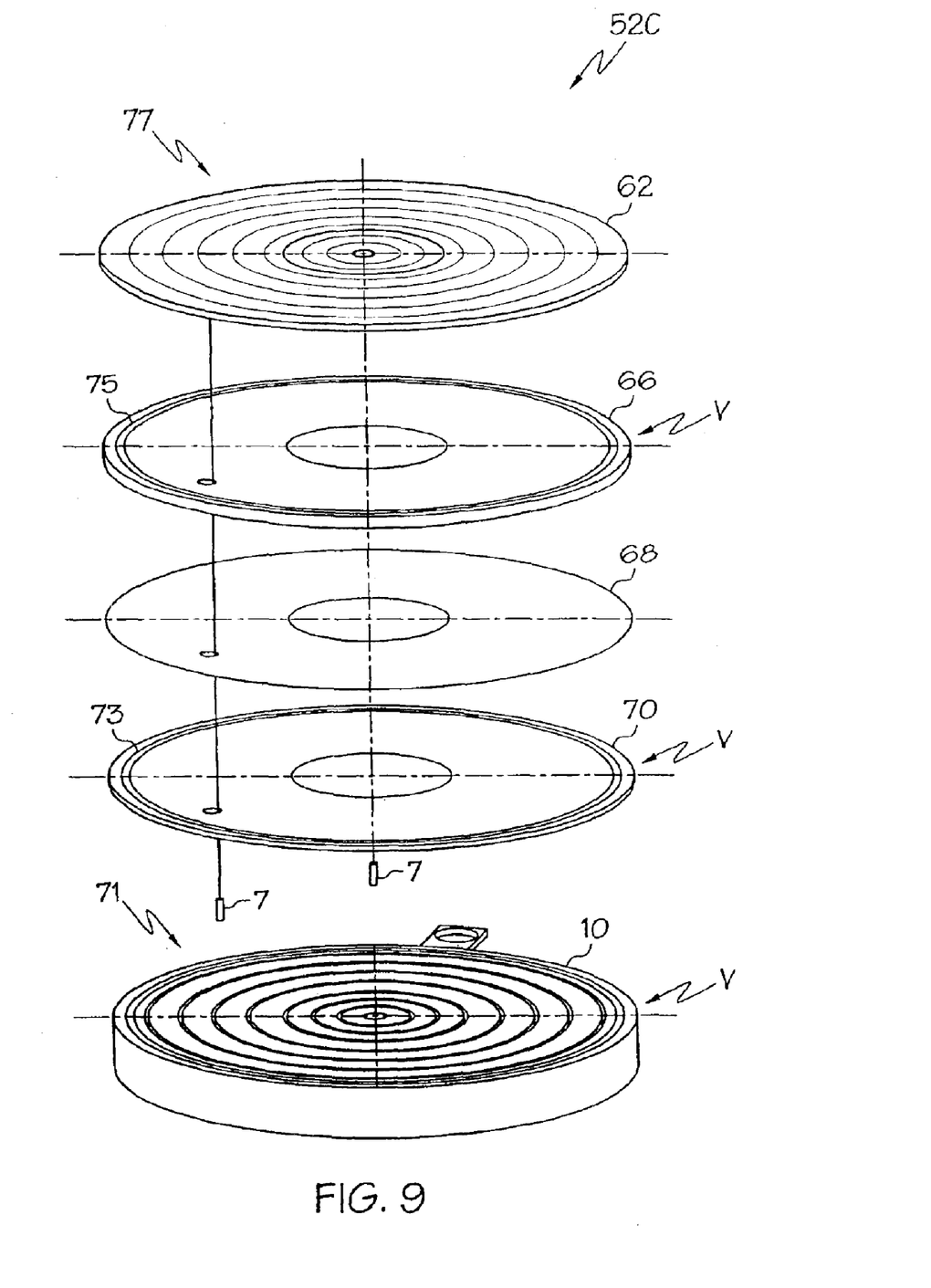
FIG. 9 contains a schematic exploded view of one embodiment of the thermal plate assembly of the invention with the mounting approach used to accommodate multiple interchangeable types of top surface assemblies.

As noted above, vacuum is used to hold the top surface assembly 52 to the thermal plate 10. Vacuum is also used to hold individual layers of the surface assembly 52 together. For example, FIG. 9 is a schematic exploded view of the surface 52C of FIG. 8C. As shown in FIG. 9, the top of the thermal plate includes a vacuum pattern 71 used to hold the lower insulator layer 70. The reference "V" refers to the vacuum grooves. The lower insulator 70 includes a vacuum pattern 73 used to hold the guard layer 68. Vacuum passes through vacuum holes in the guard layer 68 up to and through the upper insulator layer 66 where a vacuum pattern 75 on both sides of layer 66 is used both to hold a top layer 62 and to hold layer 66 to layer 68. FIG. 9 also illustrates the locating pins 7 used to hold the layers in position.

Figure 10:
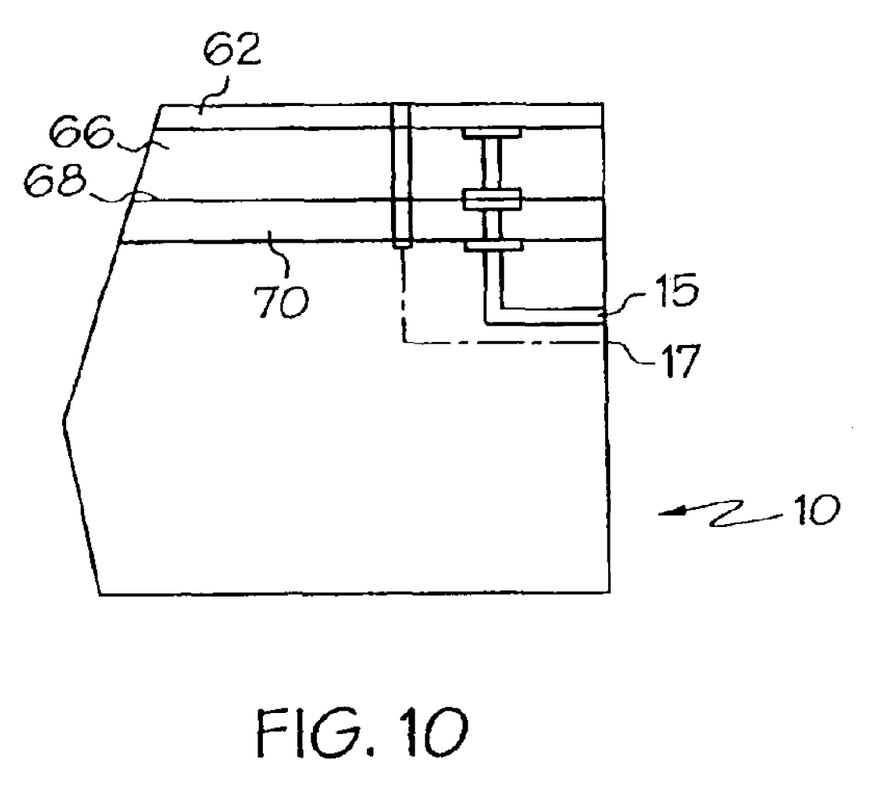
FIG. 10. contains a schematic partial cross-sectional view of a portion of the workpiece chuck according to the invention.

FIG. 10 is a schematic partial cross-section of the thermal plate 10 with the surface assembly 52C of FIG. 9 mounted thereon. FIG. 10 illustrates the vacuum ports 15 and 17 and distribution of the vacuum to the layers of the surface assembly 52C.

The thermal plate 10 and other components of the chuck of the invention can also include a surface finish that has both high durability and electrical isolation characteristics. In applications where the thermal plate and the top surface assembly 52 have different thermal expansion coefficients, the two components will move relative to each other as temperature is changed. As a result, abrasion occurs at the interface between the two components. In one application, the surface 52 is a very hard ceramic material and the thermal plate is much softer material such as cast aluminum. The softer thermal plate 10 is scratched and abraded. This is especially true at high temperatures, where the ceramic and aluminum tend to bond to each other. In accordance with the invention, a hard surface covering, such as a hard anodize plating, is provided on the top surface of the thermal plate 10 to eliminate the abrasion and bonding between the thermal plate 10 and the surface assembly 52.

In another application, the bottom of the surface assembly 52 is metal. The hard anodize coating can be applied to either the top surface of the thermal plate 10 or the bottom surface of the surface assembly 52. In this case, the anodize coating provides electrical isolation between the thermal plate 10 and the surface assembly.

In still another application, the hard anodize coating is applied to the top of the thermal plate 10. Then, a conductive layer is bonded to the anodized layer. Next, a final layer of anodize is applied to the top of the conductive layer. The conductive top surface layer 62 of the surface assembly 52 is then mounted on the final anodize layer. In this configuration, the conductive layer between the two anodize layers can be used as a guard layer. The electrically conductive guard plate is insulated by the layers of anodize from both the thermal plate 10 and the surface assembly 52. Therefore, this anodize-conductor-anodize-conductor structure can be used instead of the top surface assembly 52C of FIG. 8C. This approach is considerably less expensive and simpler to implement than the multilayer structure of FIG. 8C. Also, the guard layer can be made inexpensively and quickly by anodizing a thin sheet of conductive material such as aluminum on both sides or all over its exterior.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A thermal control apparatus for a workpiece chuck, the thermal control apparatus comprising;
   a heating element disposed in the thermal control apparatus;
   a first port connected to the heating element for providing a heating medium to the heating element;
   a cooling element disposed in the thermal control apparatus; and
   a second port connected to the cooling element for providing a cooling medium to the cooling element; wherein
   the heating element and the cooling element are disposed in a substantially coiled configuration between an edge of a surface of the thermal control apparatus and a center of the surface of the thermal control apparatus, and the heating element and the cooling element define at least one plane substantially parallel to the surface of the thermal control apparatus which passes through the heating element and the cooling element, and the cooling element comprises an input and an output path, at least a portion of the input path and the output path being adjacent to each other.

2. The thermal control apparatus of claim 1, wherein the heating element comprises a resistive heating element.

3. The thermal control apparatus of claim 1, wherein the cooling element comprises at least one tube for circulating cooling fluid through the thermal control apparatus.

4. The thermal control apparatus of claim 3, wherein the heating element comprises a resistive heating element.

5. The thermal control apparatus of claim 4, wherein the healing element is electrically isolated from the thermal control apparatus.

6. The thermal control apparatus of claim 5, wherein the isolation impedance is over 100 Gigohms.

7. The thermal control apparatus of claim 4, wherein the plane is a center plane of the thermal control apparatus halfway between a top surface of the thermal control apparatus and a bottom surface of the thermal control apparatus.

8. The thermal control apparatus of claim 1, wherein the plane is a center plane of the thermal control apparatus halfway between a top surface of the thermal control apparatus and a bottom surface of the thermal control apparatus.

9. The thermal control apparatus of claim 1, further comprising a housing enclosing the heating element and the cooling element, the housing being made from a cast metal.

10. The thermal control apparatus of claim 9, wherein the metal comprises aluminum.

11. The thermal control apparatus of claim 9, wherein the metal is pure aluminum.

12. The thermal control apparatus of claim 9, wherein the metal is an alloy with low thermal distortion.

13. The thermal control apparatus of claim 1, wherein the thermal control apparatus is a layer of the workpiece chuck.

14. The thermal control apparatus of claim 13, wherein the heating element comprises a resistive heating element.

15. The thermal control apparatus of claim 13, wherein the cooling element comprises at least one tube for circulating cooling fluid.

16. The thermal control apparatus of claim 15, wherein the heating element comprises a resistive heating element.

17. The thermal control apparatus of claim 16, wherein the plane in is a center plane of the thermal control apparatus halfway between a top surface of the thermal control apparatus and a bottom surface of the thermal control apparatus.

18. The thermal control apparatus of claim 13, wherein the plane is a center plane of the thermal control apparatus halfway between a top surface of the thermal control apparatus and a bottom surface of the thermal control apparatus.

19. The thermal control apparatus of claim 13, further comprising a housing enclosing the heating element and the cooling element, the housing being made from a cast metal.

20. The thermal control apparatus of claim 19, wherein the metal comprises aluminum.

* * * * *

UNITED STATES PATENT AND TRADEMARK OFFICE
CERTIFICATE OF CORRECTION

PATENT NO. : 6,969,830 B2
DATED : November 29, 2005
INVENTOR(S) : Kenneth M. Cole, Sr. et al.

It is certified that error appears in the above-identified patent and that said Letters Patent is hereby corrected as shown below:

Column 8,
Line 55, insert -- path -- after "input".
Line 66, delete "healing" and insert -- heating --.

Column 10,
Line 9, delete "in" between "plane" and "is".

Signed and Sealed this

Twenty-fifth Day of April, 2006

JON W. DUDAS
*Director of the United States Patent and Trademark Office*